(12) United States Patent
Pasadyn et al.

(10) Patent No.: US 6,698,009 B1
(45) Date of Patent: Feb. 24, 2004

(54) METHOD AND APPARATUS FOR MODELING OF BATCH DYNAMICS BASED UPON INTEGRATED METROLOGY

(75) Inventors: Alexander J. Pasadyn, Austin, TX (US); Christopher A. Bode, Austin, TX (US)

(73) Assignee: Advanced Micro Devices, Inc., Austin, TX (US)

(*) Notice: Subject to any disclaimer, the term of this patent is extended or adjusted under 35 U.S.C. 154(b) by 99 days.

(21) Appl. No.: 10/085,938

(22) Filed: Feb. 28, 2002

(51) Int. Cl.[7] .............................................. G06F 17/50
(52) U.S. Cl. ........................... 716/19; 716/1; 700/109; 700/121
(58) Field of Search ...................... 716/1–21; 700/108, 700/109, 110, 112, 121; 702/81, 84

(56) References Cited

U.S. PATENT DOCUMENTS 6,410,351 B1 * 6/2002 Bode et al. ................... 438/14
6,460,002 B1 * 10/2002 Bone et al. .................... 702/81
6,535,774 B1 * 3/2003 Bode et al. ................. 700/109
6,587,744 B1 * 7/2003 Stoddard et al. ............ 700/121
6,594,589 B1 * 7/2003 Coss et al. ..................... 702/34
2002/0065900 A1 * 5/2002 Dor et al. .................... 709/217
2003/0029383 A1 * 2/2003 Ward et al. .................. 118/719

* cited by examiner

*Primary Examiner*—Vuthe Siek
(74) *Attorney, Agent, or Firm*—Williams, Morgan & Amerson, P.C.

(57) ABSTRACT

A method and an apparatus for performing modeling of batch dynamics in processing of semiconductor wafers. The method includes performing the process on the first semiconductor wafer in a lot, the process being controlled by a tool model, and acquiring integrated metrology data related to the process of the first semiconductor wafer using an integrated metrology tool. The method further includes performing a lot dynamic modeling process based upon an analysis of the integrated metrology data, the lot dynamic modeling process comprising adjusting the tool model based upon analysis of the integrated metrology data, and performing the process on a second semiconductor wafer in the lot based upon the adjusted tool model.

21 Claims, 8 Drawing Sheets

METHOD AND APPARATUS FOR MODELING OF BATCH DYNAMICS BASED UPON INTEGRATED METROLOGY

BACKGROUND OF THE INVENTION

1. Field of the Invention

This invention relates generally to semiconductor manufacturing, and, more particularly, to a method and apparatus using metrology data from an integrated source for modeling system dynamics within a process batch of semiconductor wafers.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging, and final testing of the completed device, are so different from one another and specialized that the processes may be performed in different manufacturing locations that contain different control schemes.

Generally, a set of processing steps is performed on a group of semiconductor wafers, sometimes referred to as a lot. For example, a process layer composed of a variety of materials may be formed above a wafer. Thereafter, a patterned layer of photoresist may be formed above the process layer using known photolithography techniques. Typically, an etch process is then performed on the process layer using the patterned layer of photoresist as a mask. This etching process results in formation of various features or objects in the process layer. Such features may be used for a gate electrode structure for transistors. Many times, trench structures are also formed on the substrate of the semiconductor wafer to isolate electrical areas on a semiconductor wafer. One example of an isolation structure that can be used is a shallow trench isolation (STI) structure. Typically, STI structures are formed on the semiconductor wafers by forming trenches in the wafer and filling such trenches with an insulating material, such as silicon dioxide.

The manufacturing tools within a semiconductor manufacturing facility typically communicate with a manufacturing framework or a network of processing modules. Each, manufacturing toot is generally connected to an equipment interface. The equipment interface is connected to a machine interface to which a manufacturing network is connected, thereby facilitating communications between the manufacturing tool and the manufacturing framework. The machine interface can generally be part of an advanced process control (APC) system. The APC system initiates a control script, which can be a software program that automatically retrieves the data needed to execute a manufacturing process.

FIG. 1 illustrates a typical semiconductor wafer 105. The wafer 105 typically includes a plurality of individual semiconductor die 155 arranged in a grid 150. Photolithography steps are typically performed by a stepper on approximately one to four die locations at a time, depending on the specific photomask employed. Photolithography steps are generally performed to form a patterned layer of photoresist above one or more process layers that are to be patterned. The patterned photoresist layer can be used as a mask during etching processes, wet or dry, performed on the underlying layer or layers of material, e.g., a layer of polysilicon, metal or insulating material, to transfer the desired pattern to the underlying layer. The patterned layer of photoresist is comprised of a plurality of features, e.g., line-type features or opening-type features that are to be replicated in an underlying process layer.

Turning now to FIG. 2, one example of a general block diagram representation of a typical manufacturing process flow is illustrated. A manufacturing lot or batch of semiconductor wafers 105 are processed (block 210). After a lot/batch of wafers 105 are processed, generally, metrology data may then be acquired (block 220). The metrology data is analyzed by a processing system. Based upon the analysis, the processing system determines whether there are any errors in the processed semiconductor wafers 105 (block 230). Generally, the errors are determined based upon the aggregate data relating to the metrology data from the batch/lot of wafers 105. In other words, the metrology data as a whole, is used to determine whether substantial errors exist on the processed semiconductor wafers 105. Subsequently, the tool operation may be modified based upon the errors detected from the analysis of the metrology data (block 240).

The errors that may be the basis for adjusting the operation of the tool may vary within a particular lot. Variations in the processing tool and/or the metrology tool may produce different errors within a batch of semiconductor wafers 105. Often, a processing tool may process an initial set of wafers 105 in a batch slightly differently from subsequent wafers 105 in the batch, resulting in an initial wafer 105 effect. Furthermore, slight drifts in the processing and/or the metrology tool operation may cause a variation in the metrology data acquired within a batch of wafers 105. Therefore, wholesale changes to the tool operation based upon the metrology data of an entire batch of semiconductor wafers 105 may not accurately adjust for errors that occur as a batch of wafers 105 progress through a processing step.

The present invention is directed to overcoming, or at least reducing, the effects of, one or more of the problems set forth above.

SUMMARY OF THE INVENTION

In one aspect of the present invention, a method is provided for performing modeling of batch dynamics in processing of semiconductor wafers. The method includes performing the process on the first semiconductor wafer in a lot, the process being controlled by a tool model, and acquiring integrated metrology data related to the process of the first semiconductor wafer using an integrated metrology tool. The method further includes performing a lot dynamic modeling process based upon an analysis of the integrated metrology data, the lot dynamic modeling process comprising adjusting the tool model based upon analysis of the integrated metrology data, and performing the process on a second semiconductor wafer in the lot based upon the adjusted tool model.

In another aspect of the present invention, a system is for performing modeling of batch dynamics in processing of semiconductor wafers. The system of the present invention comprises: a process controller adapted to adjust a process performed on a lot of semiconductor wafers based upon analysis of integrated metrology data analyzed by the process controller; an integrated metrology data storage unit operatively coupled to the process controller, the integrated metrology data storage unit adapted to receive and store integrated metrology data; a tool model operatively coupled to the process controller, the tool model adapted to control a processing operation on a lot of semiconductor wafers; and a process controller operatively coupled to the integrated metrology data storage unit and the tool model, the process controller adapted to adjust the tool model based upon analysis of the integrated metrology data received from the integrated metrology data storage unit.

In yet another aspect of the present invention, a computer readable program storage device encoded with instructions is for performing modeling of batch dynamics in processing of semiconductor wafers. The computer readable program storage device encoded with instructions when executed by a computer: performs a process on a first semiconductor wafer in a lot, the process being controlled by a tool model; acquires integrated metrology data related to the process of the first semiconductor wafer using an integrated metrology tool; performs a lot dynamic modeling process based upon an analysis of the integrated metrology data, the lot dynamic modeling process comprising adjusting the tool model based upon analysis of the integrated metrology data; and performs the process on a second semiconductor wafer in the lot based upon the adjusting of the tool model.

BRIEF DESCRIPTION OF THE DRAWINGS

The invention may be understood by reference to the following description taken in conjunction with the accompanying drawings, in which like reference numerals identify like elements, and in which.

Figure 1:
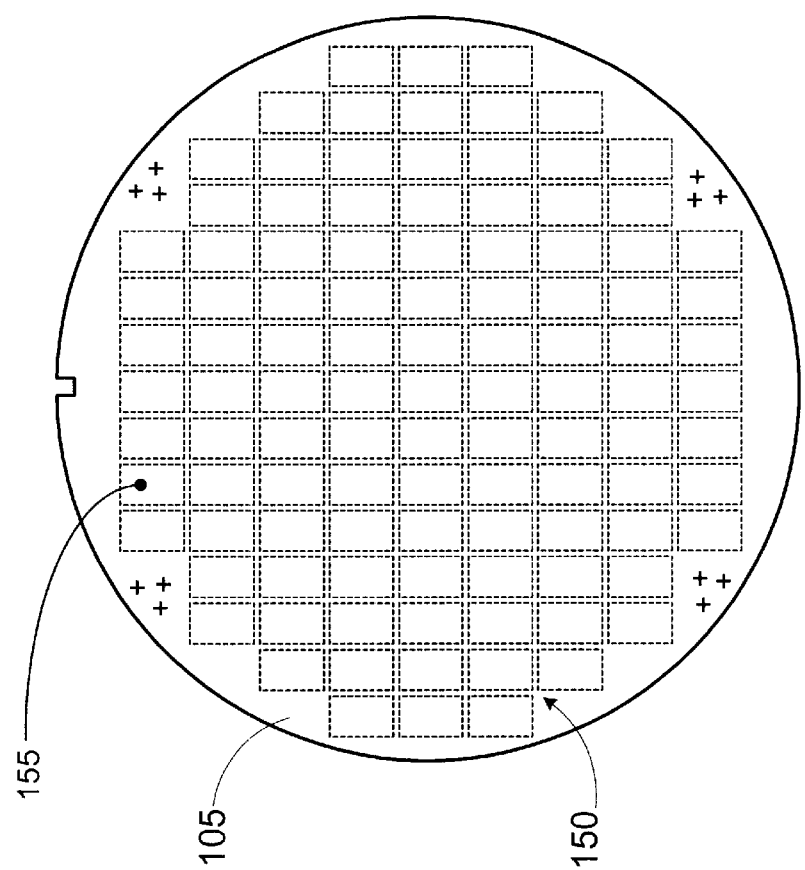
FIG. 1 is a simplified diagram of a prior art semiconductor wafer being processed.
Figure 2:
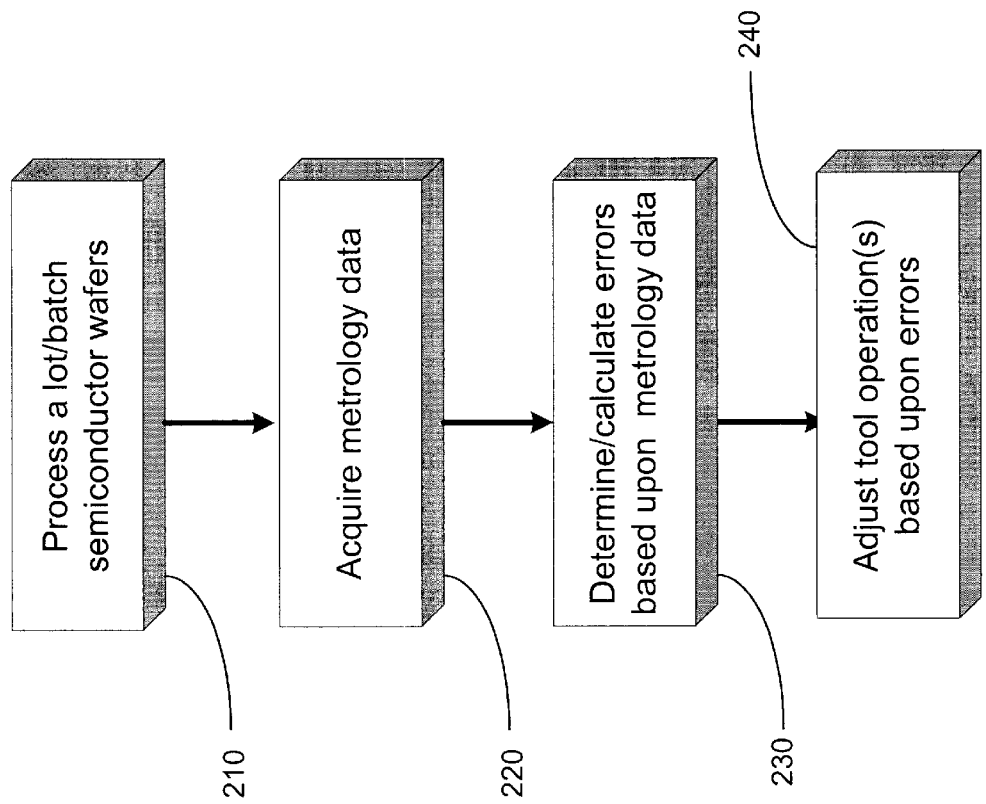
FIG. 2 illustrates a simplified flowchart depiction of a prior art process flow during manufacturing of semiconductor wafers.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discrete processes that are involved in semiconductor manufacturing. Many times, semiconductor devices are stepped through multiple manufacturing process tools. Often, at least a portion of a manufacturing lot of semiconductor wafers 105 are examined by offline metrology tools after a process operation is performed on the semiconductor wafers 105. Errors discovered during this examination can be used to generate modifications for subsequent processes performed on the semiconductor wafers 105. These modifications to the new process are generally used to reduce the effects of errors discovered in the original process. Many times, offline metrology data results become available too late for performing such modifications in a timely manner during the processing of a batch (or lot) of semiconductor wafers 105.

The behavior of a processing tool may vary as wafers 105 in a lot progress through the processing steps performed by the processing tool. In a general sense, embodiments of the present invention provide for acquiring integrated metrology data and using the metrology data to dynamically effect the operation of the tool on an intra-lot basis (e.g., on a wafer-to-wafer basis). Embodiments of the present invention provide for performing a lot dynamic modeling process that may dynamically alter the characteristic of a tool model, which may be used to operate a particular processing tool. Embodiments of the present invention also provide for using a lot dynamic modeling process to compensate for changes in the performance of a particular tool during the processing of a lot of semiconductor wafers 105.

In one embodiment, offline metrology data includes metrology data that is not part of the production flow during processing of semiconductor wafers 105. For example, offline metrology data may refer to electrical test results of the processed semiconductor wafers 105, yield of the processed semiconductor wafers 105, and the like. In one embodiment, integrated metrology data may include inline metrology data. In one embodiment, inline metrology data includes metrology data acquired by a standalone metrology tool yielding data associated with a particular processing operation. For example, inline metrology data may include data relating to film thickness, line-width of certain features on processed semiconductor wafers 105, overlay measurements resulting from photolithography measurements, and the like. An integrated metrology tool, which is described in greater detail below, may be used to acquire integrated metrology data. In one embodiment, integrated metrology data includes inline metrology data that is acquired by a metrology tool integrated into a processing tool, which is described in greater detail below.

Figure 3:
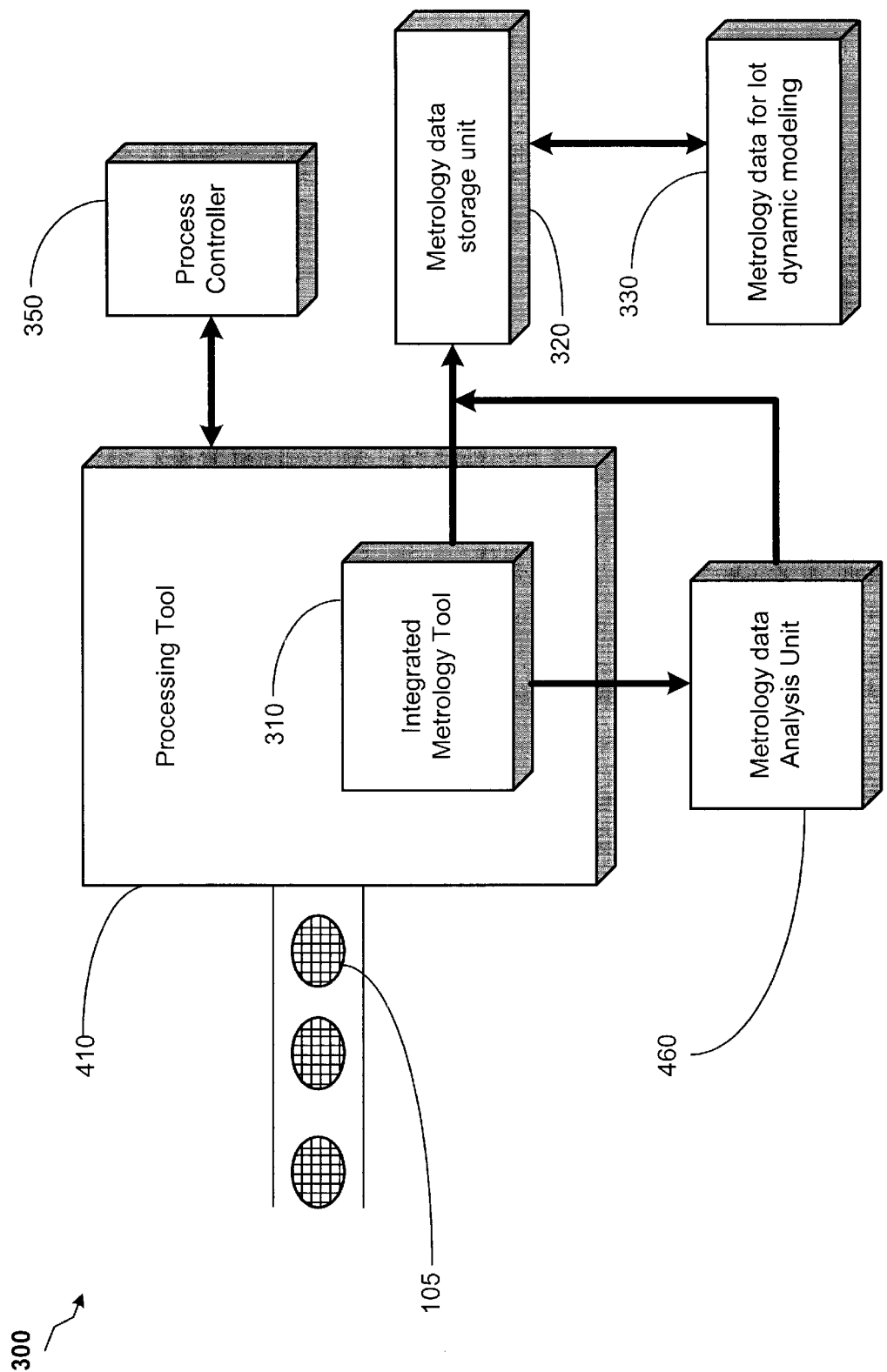
FIG. 3 is a block diagram representation of a system in accordance with one illustrative embodiment of the present invention.

Turning now to FIG. 3, a system 300 capable of performing the methods taught by at least one embodiment of the present invention is illustrated. In one embodiment, a processing tool 410 comprises an integrated metrology tool 310. The integrated metrology tool 310 is capable of acquiring integrated metrology data (e.g., acquiring metrology data of semiconductor wafers 105 while they are still under the control of the processing tool 410), which includes inline metrology data. Acquiring inline metrology data is generally less intrusive to a manufacturing process flow, as compared to acquiring offline metrology data, which requires the use of an external metrology data tool. A set of semiconductor wafers 105 may be provided to the processing tool 410 by one of a plurality of wafer transporting apparatuses, e.g., a wafer-cassette (not shown).

The integrated metrology tool 310 acquires metrology data in an inline fashion. In other words, during, or immediately following a manufacturing process, the integrated metrology tool 310 acquires data from one or more of the processed semiconductor wafers 105. In one embodiment, the integrated metrology tool 310 is placed within a chamber (not shown) associated with the processing tool 410. Data from the integrated metrology tool 310 may be sent to a metrology data analysis unit 460. The metrology data analysis unit 460 organizes, analyzes, and correlates metrology data acquired by the integrated metrology tool 310 to particular semiconductor wafers 105 that were examined. The analysis performed by the metrology data analysis unit 460 may comprise comparing acquired metrology data to predetermined tolerances, and concluding that there is an error if the differences in the comparison is outside the tolerances. The metrology data analysis unit 460 can be a software unit, a hardware unit, or a firmware unit. In various embodiments, the metrology data analysis unit 460 is integrated into the computer system 430 (shown in FIG. 4).

The metrology data analysis unit 460 forwards the integrated metrology data to the metrology data storage unit 320. The metrology data storage unit 320 stores the metrology data such that it can be retrieved by the system 300 for further analysis during or after a manufacturing process cycle. Data from the metrology data analysis unit 460 and/or the metrology data storage unit 320 provides metrology data for lot dynamic modeling (block 330), which can be used to further correct or enhance the accuracy of one or more processes performed on the semiconductor wafers 105 within a particular lot. In other words, the system illustrated in FIG. 3 is capable of performing wafer-to-wafer process control. The system 300 also comprises a process controller 350, which is capable of controlling the functions and operations of the components of the system 300 described above. The process controller 350 may be a software, hardware, firmware, or a combination thereof.

Figure 4:
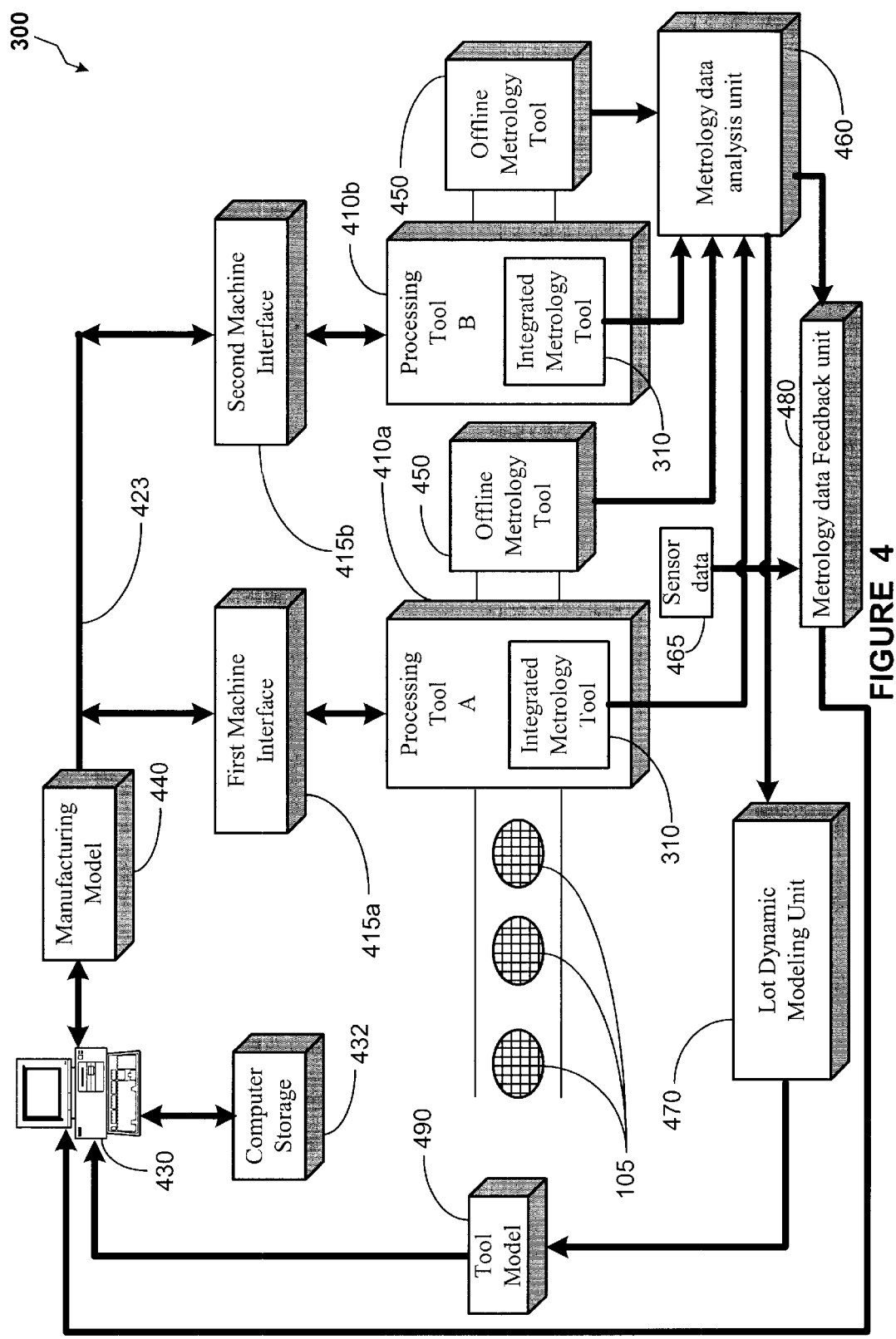
FIG. 4 illustrates a more detailed block diagram representation of the system shown in FIG. 3, in accordance with one illustrative embodiment of the present invention.

Turning now to FIG. 4, a more detailed block diagram of the system 300 in accordance with one embodiment of the present invention is illustrated. Semiconductor wafers 105 are processed on processing tools 410a, 410b using a plurality of control input signals, or manufacturing parameters, provided via a line or network 423. The control input signals, or manufacturing parameters, on the line 423 are sent to the processing tools 410a, 410b from a computer system 430 via machine interfaces 415a, 415b. The first and second machine interfaces 415a, 415b are generally located outside the processing tools 410a, 410b. In an alternative embodiment, the first and second machine interfaces 415a, 415b are located within the processing tools 410a, 410b. The semiconductor wafers 105 are provided to and carried from a plurality of processing tools 410. In one embodiment, semiconductor wafers 105 may be provided to a processing tool 410 manually. In an alternative embodiment, semiconductor wafers 105 may be provided to a processing tool 410 in an automatic fashion (e.g., robotic movement of semiconductor wafer 105). In one embodiment, a plurality of semiconductor wafers 105 is transported in lots (e.g., stacked in cassettes) to the processing tools 410.

In one embodiment, the computer system 430 sends control input signals, or manufacturing parameters, on the line 423 to the first and second machine interfaces 415a, 415b. The computer system 430 is capable of controlling processing operations. In one embodiment, the computer system 430 is a process controller. The computer system 430 is coupled to a computer storage unit 432 that may contain a plurality of software programs and data sets. The computer system 430 may contain one or more processors (not shown) that are capable of performing the operations described herein. The computer system 430 employs a manufacturing model 440 to generate control input signals on the line 423. In one embodiment, the manufacturing model 440 contains a manufacturing recipe that determines a plurality of control input parameters that are sent on the line 423 to the processing tools 410a, 410b.

In one embodiment, the manufacturing model 440 defines a process script and input control that implement a particular manufacturing process. The control input signals (or control input parameters) on the line 423 that are intended for processing tool A 410a are received and processed by the first machine interface 415a. The control input signals on the line 423 that are intended for processing tool B 410b are received and processed by the second machine interface 415b. Examples of the processing tools 410a, 410b used in semiconductor manufacturing processes are steppers, etch process tools, deposition tools, and the like.

One or more of the semiconductor wafers 105 that are processed by the processing tools 410a, 410b can also be sent to an offline metrology tool 450 for acquisition of metrology data. The offline metrology tool 450 can be a scatterometry data acquisition tool, an overlay-error measurement tool, a critical dimension measurement tool, and the like. In one embodiment, an offline metrology tool 450 examines one or more processed semiconductor wafers 105. Furthermore, the integrated metrology tool 310 within the processing tools 410a and 410b may also collect metrology data. The metrology data analysis unit 460 may collect, organize, and analyze data from the integrated metrology tool 310 and/or the offline metrology tool 450. The metrology data is directed to a variety of physical or electrical characteristics of the devices formed on the wafers 105. For example, metrology data may be obtained as to line width measurements, depth of trenches, sidewall angles, thickness, resistance, and the like. The metrology data analysis unit 460 sends metrology data, including inline-type metrology data, and offline metrology data, from the integrated metrology tool 310 and/or offline metrology tool 450, respectively, to the metrology data storage unit 320 for storage.

The system 300 further comprises a lot dynamic modeling unit 470, a metrology data feedback unit 480, and a tool model 490. The lot dynamic modeling unit 470 receives metrology data from the metrology data analysis unit 460. The lot dynamic modeling unit 470 also receives sensor data 465 from sensors associated with the processing tools 410.

The lot dynamic modeling unit 470 dynamically adjusts the tool model 490 in order to modify the operations of the processing tool 410. The tool model 490 causes the computer system 430 to modify the manufacturing model 440, which affects the operation of the processing tools 410a, 410b. The metrology data analysis unit 460 also provides metrology data for the metrology data feedback unit 480, which generates feedback data for modification to the processing tools 410 based upon errors detected from the metrology data and/or based upon the lot dynamic calculations performed by the system 300.

In one embodiment, the metrology data storage unit 320, the metrology data analysis unit 460, the lot dynamic modeling unit 470, the feed-back unit 480, and/or the tool model 490 are software or firmware components of a computer system that can be a standalone unit or that can be integrated into the computer system 430.

Figure 5:
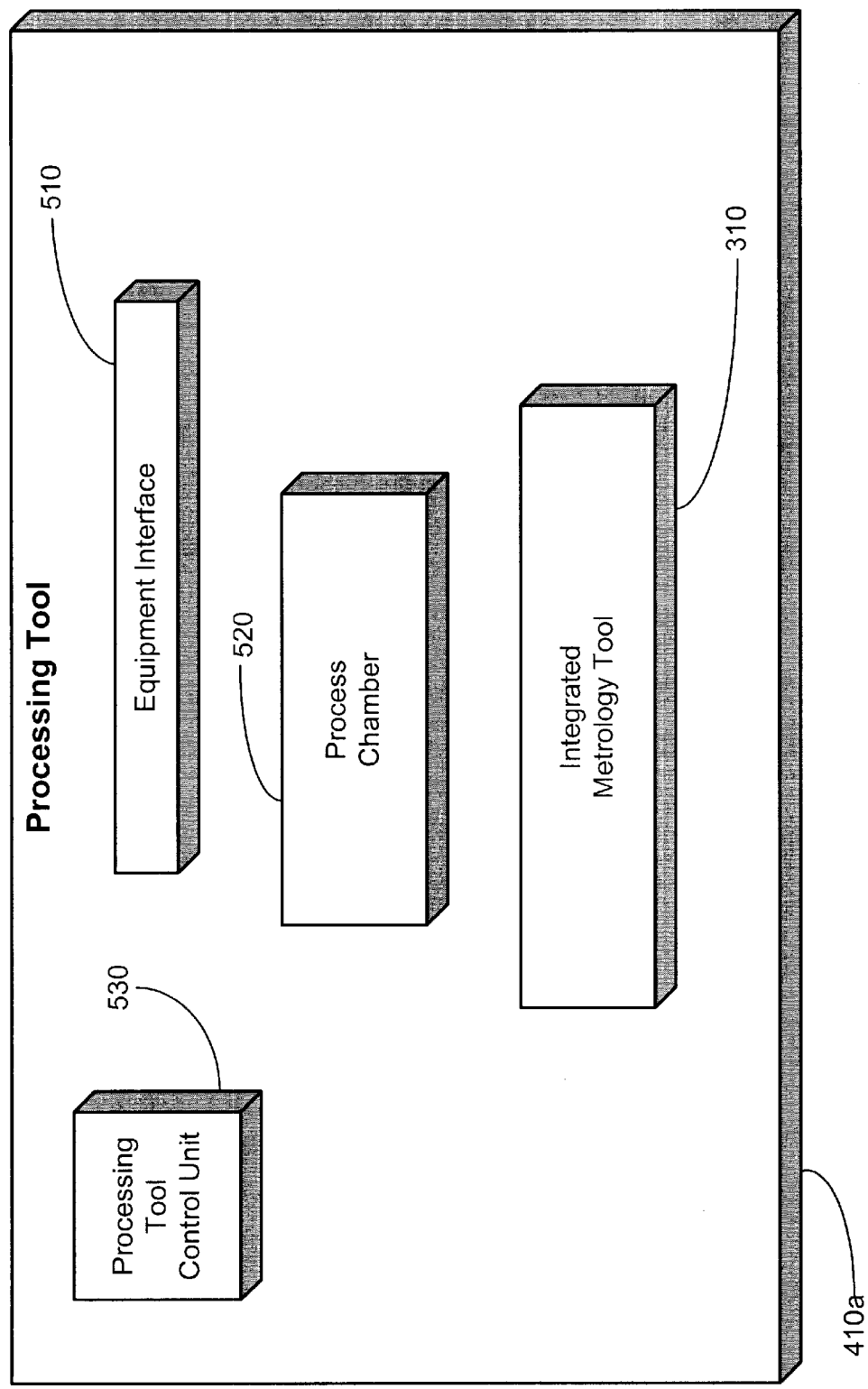
FIG. 5 illustrates a more detailed block diagram representation of a processing tool shown in FIGS. 3 and 4, in accordance with one illustrative embodiment of the present invention.

Turning now to FIG. 5, a more detailed block diagram illustration of an illustrative processing tool, such as processing tool 410a, is shown. In one embodiment, the processing tool 410 comprises an equipment interface 510, a process chamber 520, a processing tool control unit 530, and an integrated metrology tool 310. The processing tool 410 receives control parameter data via the equipment interface 510. Data from the processing tool 410 is also sent to other portions of the system 300, such as the computer system 430, via the equipment interface 510. The processing tool control unit 530 controls processing operations of semiconductor wafers 105 in the process chamber 520. The processing tool control unit 530 receives control parameter data, and/or instructions from the computer system 430, via the equipment interface 510, and executes the appropriate action.

The integrated metrology tool 310 acquires metrology data of the semiconductor wafers 105 that were processed in the process chamber 520. The processing tool control unit 530 also controls the integrated metrology tool 310. In accordance with embodiments of the present invention, the integrated metrology tool 310 acquires metrology data from semiconductor wafers 105 that are processed and makes such data available to the system 300 for more efficient and quick analysis of metrology data.

Figure 6:
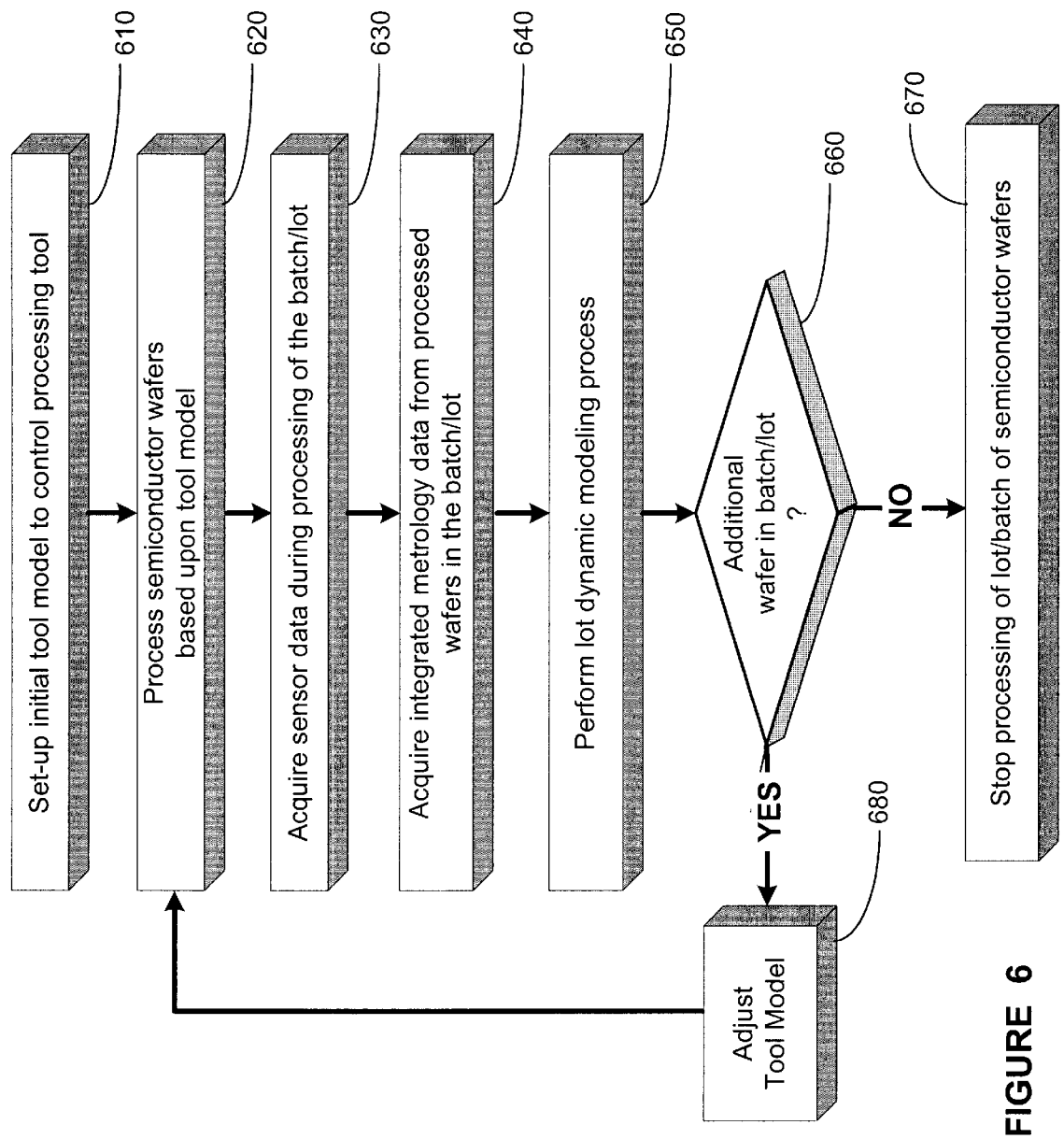
FIG. 6 illustrates a flowchart depiction of a method in accordance with one illustrative embodiment of the present invention.

Turning now to FIG. 6, a flow chart depiction of the method for implementing one embodiment of the present invention is illustrated. The system 300 sets up an initial tool model 490 for the operation of the processing tool 410 (block 610). In one embodiment, previous behavior of the processing tool 410 may be utilized to form the tool model 490, which controls the operation of the processing tool 410. Subsequently, the system 300 initiates the processing of semiconductor wafers 105 of a particular batch/lot of wafers 105 using the tool model 490 (block 620). During the processing of the wafers 105, the system 300 acquires sensor data, which includes sensor data that relates to the time period when particular wafers 105 are processed (block 630). In one embodiment, the system 300 stores the sensor data for later analysis. The system 300 also acquires integrated metrology data upon processing of individual wafers 105 in the wafer lot (block 640). A more detailed description of acquiring integrated metrology data is provided in FIG. 7 and the accompanying description below.

Figure 8:
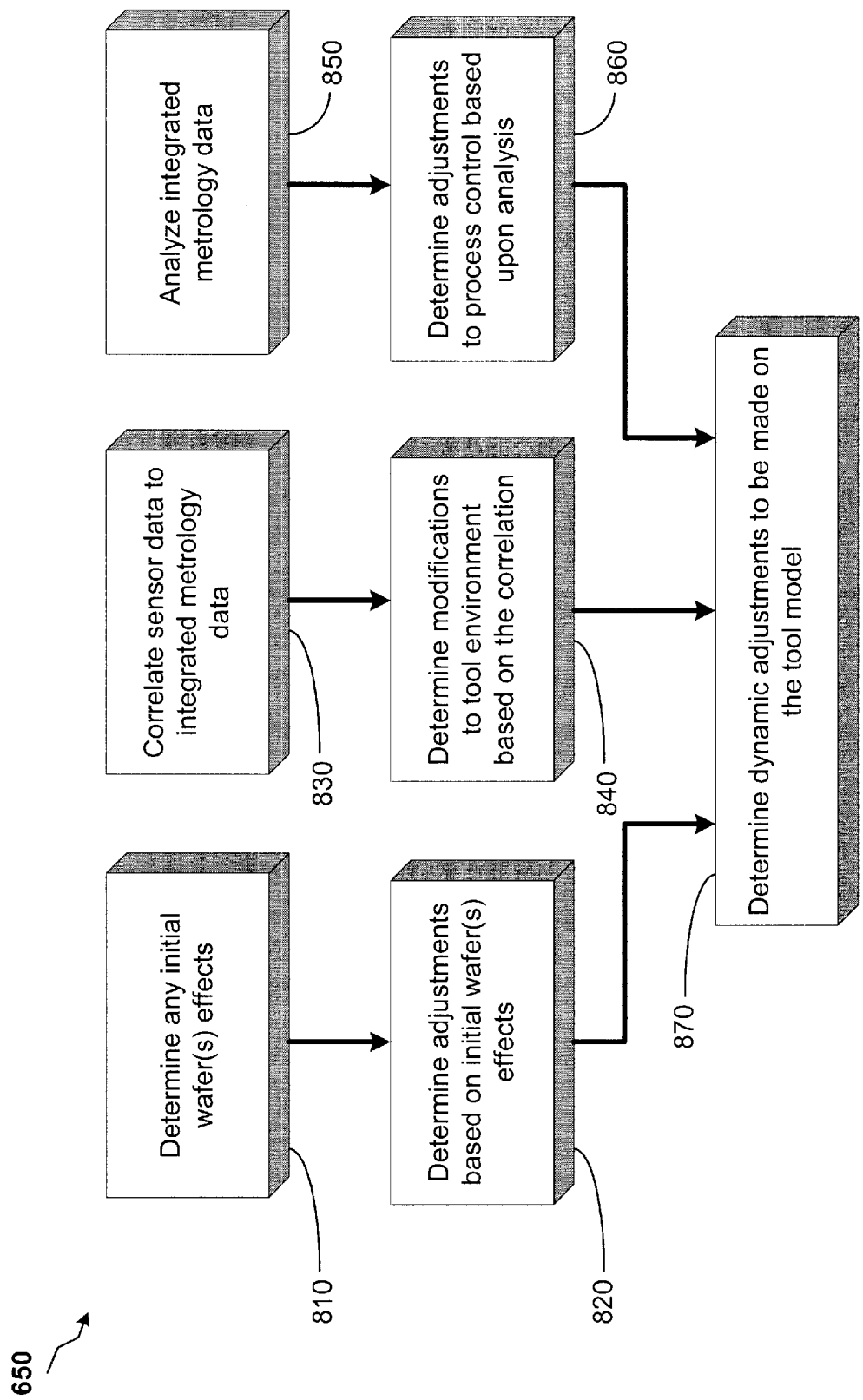
FIG. 8 illustrates a flowchart depiction of a method of performing lot dynamic modeling, as indicated in FIG. 6, in accordance with illustrative one embodiment of the present invention.

Once the system 300 acquires sensor data and integrated metrology data relating to at least one processed wafer 105, the system 300 performs a lot dynamic modeling process (block 650). A more detailed description of the steps of performing the lot dynamic modeling process indicated in block 650 is illustrated in FIG. 8 and provided in the accompanying description below. The lot dynamic modeling process results in data relating to adjustments that can be made to the tool model 490 while the processing tool 410 is processing a lot of semiconductor wafers 105. The tool model 490 allows the system 300 to dynamically modify the operation of the processing tool 410 during the processing of a lot of semiconductor wafers 105.

The system 300 then determines whether there are additional wafers 105 in the lot to be processed (block 660). When the system 300 determines that no additional wafers 105 are left to be processed in the lot, the processing of the lot is terminated (block 670). When the system 300 determines that there is at least one additional wafer 105 to be processed in the lot, an adjustment to the tool model 490 may be performed (block 680). The adjustment to the tool model 490 is made based upon the dynamic adjustments that were calculated during the lot dynamic modeling process indicated in block 650. The adjustments to the tool model 490 result in one of a plurality of control adjustments and/or tool state adjustments (e.g., such as temperature in the chamber, pressure, gas mixture, and the like). Once adjustments to the tool model 490 are performed, subsequent wafer(s) 105 in the lot is processed as indicated by the path from block 610 to block 620, and steps in FIG. 6 are repeated.

Figure 7:
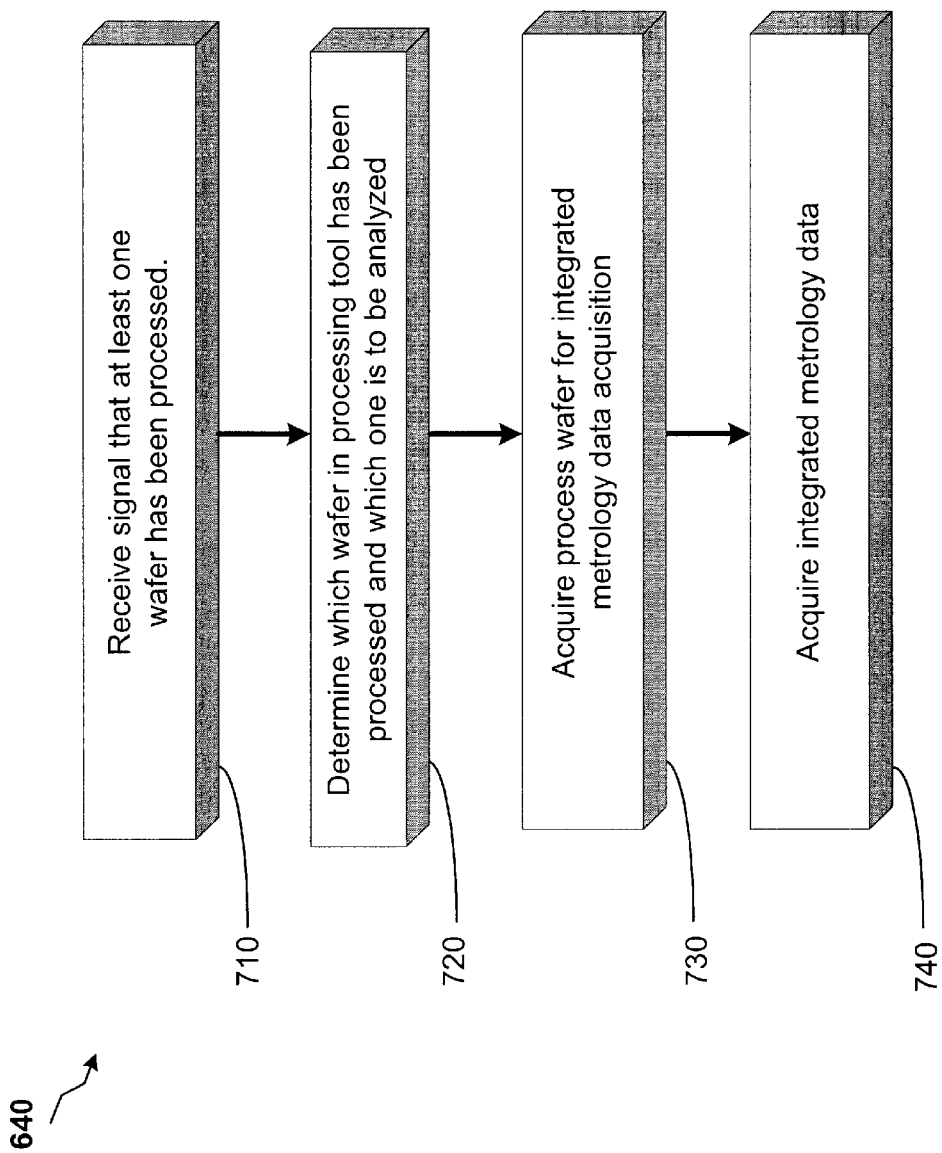
FIG. 7 illustrates a flowchart depiction of a method of acquiring integrated metrology data, as indicated in FIG. 6, in accordance with one illustrative embodiment of the present invention.

Turning now to FIG. 7, a flowchart depiction of one illustrative embodiment of a method for acquiring integrated metrology data is illustrated. After the system 300 processes a semiconductor wafer 105, a signal is received by the system 300 indicating that at least one semiconductor wafer 105 has been processed (block 710). In one embodiment, the equipment interface 510 sends a signal to the computer system 430, indicating the status of a process completion. When the system 300 learns that a semiconductor wafer 105 has been processed, it makes a determination as to which semiconductor wafer 105 in the tool has been processed and is next in queue for metrology analysis (block 720). Generally, the order of metrology analysis performed on the semiconductor wafers 105 follows the order of processing within the processing tool 410. Once the system 300 determines and targets a particular semiconductor wafer 105 for inline metrology analysis, the system 300 acquires that particular wafer 105 for integrated metrology data acquisition (block 730).

The system 300 then acquires integrated metrology data from the targeted semiconductor wafer 105 (block 740) using the integrated metrology tool 310. In one embodiment, integrated metrology data is acquired immediately after the processing of a particular semiconductor wafer 105. Therefore, real time or substantially real time metrology data is provided to the system 300. The completion of the steps illustrated in FIG. 7 substantially completes the process of acquiring integrated metrology data, as indicated in block 640 of FIG. 6.

Turning now to FIG. 8, a flow chart depiction of one embodiment of performing the lot dynamic modeling process indicated in block 650 is illustrated. The system 300 determines whether there are any initial-wafer effects during the processing of a particular lot of semiconductor wafers 105 (block 810). Many times, the behavior of a processing tool 410 may vary after the processing of an initial (or a few initial) wafers 105. This is known as the initial-wafer or the first-wafer effect. Utilizing embodiments of the present invention, integrated metrology data can be used to modify the behavior of the processing tool 410 to compensate for the drift in tool behavior resulting from the initial wafer effect.

Once the initial wafer effect is detected, the system 300 determines possible adjustments that can be made to the tool model 490 based upon the initial wafer effects (block 820). For example, the temperature of the process chamber 520 may be modified after the initial wafers 105 are processed in a lot such that a more uniform processing can take place throughout the manufacturing lot. As another example, the etch-time for an etching process may be modified after the etching process performed on an initial wafer 105 in a lot.

Furthermore, the system 300 may correlate acquired sensor data 465 to corresponding integrated metrology data (block 830). In other words, the sensor data 465 acquired during the processing of a particular processing of a wafer 105 is correlated to the integrated metrology data acquired for that particular wafer 105. Based upon the correlation of the sensor data 465 and integrated metrology data, the system 300 determines possible modification(s) to the tool environment based upon the correlation (block 840). For example, the system 300 may determine that a modification to the pressure of the chamber 520 may be warranted due to the sensor data 465 that correlated to a particular error detected by analysis of the integrated metrology data.

The system 300 also analyzes the integrated metrology data (block 850). Based upon this analysis, adjustments to the process control may be made to reduce the errors that may have been detected by the analysis of the metrology data (block 860). Based upon the adjustments and/or modifications determined by the steps indicated in blocks 820, 840 and 860, dynamic adjustments to the tool model 490 are determined (block 870). The dynamic adjustments may include modifying control behavior of the processing tool 410, environment modifications relating to the processing tool 410, and the like. The dynamic adjustments to the tool model 490 are generally made while wafers 105 in a particular batch/lot are progressing through the processing tool 410. Therefore, behavior of a processing tool 410 as it processes a batch/lot of semiconductor wafers 105 may be controlled such that wafers 105 with more uniform quality are produced. The completion of the steps described in FIG. 8 substantially completes the process of performing the dynamic lot modeling indicated in block 650 of FIG. 6.

Additionally, the adjustments calculated during the lot dynamic modeling processing may be used to perform feedback adjustments. In other words, the behavior of the processing tool 410 may be modified during a subsequent processing of a semiconductor wafer 105 within the lot being processed to improve uniformity and accuracy of the process. The feedback calculations/adjustments are made based upon errors discovered during the lot dynamic modeling process. The compensation factor may be used to modify the control input parameters that control the operation of a subsequent processing of semiconductor wafers 105 within the lot. Examples of compensation factors that are used to adjust the subsequent process may include a modified etch time, a modified chemical mechanical polishing time, and/or a modified exposure dosage.

The principles taught by the present invention can be implemented in an Advanced Process Control (APC) Framework, such as a Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI. The APC is a preferred platform from which to implement the control strategy taught by the present invention. In some embodiments, the APC can be a factory-wide software system; therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system. The principles taught by the present invention can be implemented into other types of manufacturing frameworks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    performing a process on a first semiconductor wafer in a lot, said process being controlled by a tool model;
    acquiring integrated metrology data related to said process of said first semiconductor wafer, said integrated metrology data comprising metrology data acquired using an integrated metrology tool;
    performing a lot dynamic modeling process based upon an analysis of said integrated metrology data, said lot dynamic modeling process comprising adjusting said tool model based upon analysis of said integrated metrology data; and
    performing said process on a second semiconductor wafer in said lot based upon said adjusting of said tool model.

2. The method described in claim 1, further comprising performing a feedback process to perform adjustments to said process performed on said second semiconductor wafer, based upon said lot dynamic modeling process.

3. The method described in claim 2, wherein said performing a feedback process based upon said lot dynamic modeling process further comprises:
    identifying an error on said first semiconductor wafer resulting from said process;
    calculating a compensation factor for reducing an effect of said identified error;

modifying a control input parameter for said process to be performed on said second semiconductor wafer based upon said compensation factor; and performing said process on said second semiconductor wafer based upon said modified control input parameter.

4. The method described in claim 3, wherein calculating said compensation factor for reducing an effect of said identified error further comprises calculating at least one of a modified etch time, a modified chemical mechanical polishing time, and a modified exposure dosage.

5. The method described in claim 1, wherein said analysis of said integrated metrology data further comprises:

comparing said integrated metrology data to a predetermined range of tolerance; and determining that an error exists in response to a determination that at least one parameter relating to said integrated metrology data is outside said predetermined range of tolerance based upon said comparison of said integrated metrology data to said predetermined range of tolerance.

6. The method described in claim 1, wherein performing a lot dynamic modeling process further comprises:

determining an initial wafer effect resulting from processing at least one initial wafer in said lot;

calculating at least one adjustment for said tool model based upon said initial wafer effect; and adjusting said tool model based upon said calculated adjustment.

7. The method described in claim 6, further comprising correlating an acquired sensor data to said acquired integrated metrology data and calculating said at least an adjustment for said tool model based upon said correlation of said sensor data to said acquired integrated metrology data.

8. A method, comprising:

performing a process on an initial semiconductor wafer in a lot, said process being controlled by a tool model;

acquiring integrated metrology data related to said process of said initial semiconductor wafer, said integrated metrology data comprising metrology data acquired using an integrated metrology tool;

determining an initial wafer effect resulting from performing said process said initial wafer;

calculating at least one adjustment for said tool model based upon said initial wafer effect;

adjusting said tool model based upon said calculated adjustment; and performing said process on a second semiconductor wafer in said lot based upon said adjusted tool model.

9. The method described in claim 8, further comprising correlating an acquired sensor data to said acquired integrated metrology data and calculating said adjustment based upon said correlation of said sensor data to said acquired integrated metrology data.

10. A system, comprising:

a process controller adapted to adjust a process performed on a lot of semiconductor wafers based upon analysis of integrated metrology data analyzed by said process controller;

an integrated metrology data storage unit operatively coupled to said process controller, said integrated metrology data storage unit adapted to receive and store integrated metrology data, said integrated metrology data comprising metrology data acquired using an integrated metrology tool;

a tool model operatively coupled to said process controller, said tool model adapted to control a processing operation on a lot of semiconductor wafers; and a process controller operatively coupled to said integrated metrology data storage unit and said tool model, said process controller adapted to adjust said tool model based upon analysis of said integrated metrology data received from said integrated metrology data storage unit.

11. The system of claim 10, further comprising:

a computer system operatively coupled with said tool model, said computer system to perform at least one calculation of a compensation factor for adjusting the processing of a subsequent wafer in said lot;

a manufacturing model operatively coupled with said computer system, said manufacturing model to generate and modify at least one control input parameter signal that control processing of said wafer;

a machine interface operatively coupled with said manufacturing model, said machine interface being capable of receiving process recipes from said manufacturing model;

a processing tool capable of processing semiconductor wafers and operatively coupled with said machine interface, said processing tool to receive at least one control input parameter signal from said machine interface;

an integrated metrology tool integrated with said processing tool, said integrated metrology tool to acquire said integrated metrology data and sending said integrated metrology data to said integrated metrology data storage unit; and a lot dynamic modeling unit operatively coupled to said tool model, said lot dynamic modeling unit to calculate an adjustment to said tool model for affecting the operation of said processing tool.

12. The system of claim 11, wherein said computer system is capable of generating modification data for modifying at least one parameter in said tool model in response to lot dynamic modeling process.

13. The system of claim 11, wherein said integrated metrology tool is located within said processing tool.

14. An apparatus, comprising:

means for performing a process on a first semiconductor wafer in a lot, said process being controlled by a tool model;

means for acquiring integrated metrology data related to said process of said first semiconductor wafer, said integrated metrology data comprising metrology data acquired using an integrated metrology tool;

means for performing a lot dynamic modeling process based upon an analysis of said integrated metrology data, said lot dynamic modeling process comprising adjusting said tool model based upon analysis of said integrated metrology data; and means for performing said process on a second semiconductor wafer in said lot based upon said adjusting of said tool model.

15. A computer readable program storage device encoded with instructions that, when executed by a computer, performs a method, comprising:

performing a process on a first semiconductor wafer in a lot, said process being controlled by a tool model;

acquiring integrated metrology data related to said process of said first semiconductor wafer, said integrated metrology data comprising metrology data acquired using an integrated metrology tool;

performing a lot dynamic modeling process based upon an analysis of said integrated metrology data, said lot dynamic modeling process comprising adjusting said tool model based upon analysis of said integrated metrology data; and performing said process on a second semiconductor wafer in said lot based upon said adjusting of said tool model.

16. The computer readable program storage device encoded with instructions that, when executed by a computer, performs the method described in claim 15, the method further comprising performing a feedback process to perform adjustments to said process performed on said second semiconductor wafer, based upon said lot dynamic modeling process.

17. The computer readable program storage device encoded with instructions that, when executed by a computer, performs the method described in claim 16, wherein said performing a feedback process based upon said lot dynamic modeling process further comprises:

identifying an error on said first semiconductor wafer resulting from said process;

calculating a compensation factor for reducing an effect of said identified error;

modifying a control input parameter for said process to be performed on said second semiconductor wafer based upon said compensation factor; and performing said process on said second semiconductor wafer based upon said modified control input parameter.

18. The computer readable program storage device encoded with instructions that, when executed by a computer, performs the method described in claim 17, wherein calculating said compensation factor for reducing an effect of said identified error further comprises calculating at least one of a modified etch time, a modified chemical mechanical polishing time, and a modified exposure dosage.

19. The computer readable program storage device encoded with instructions that, when executed by a computer, performs the method described in claim 15, wherein said analysis of said integrated metrology data further comprises:

comparing said integrated metrology data to a predetermined range of tolerance; and determining that an error exists in response to a determination that at least one parameter relating to said integrated metrology data is outside said predetermined range of tolerance based upon said comparison of said integrated metrology data to said predetermined range of tolerance.

20. The computer readable program storage device encoded with instructions that, when executed by a computer, performs the method described in claim 15, wherein performing a lot dynamic modeling process further comprises:

determining an initial wafer effect resulting from processing at least one initial wafer in said lot;

calculating at least one adjustment for said tool model based upon said initial wafer effect; and adjusting said tool model based upon said calculated adjustment.

21. The computer readable program storage device encoded with instructions that, when executed by a computer, performs the method described in claim 20, further comprising correlating an acquired sensor data to said acquired integrated metrology data and calculating said at least an adjustment for said tool model based upon said correlation of said sensor data to said acquired integrated metrology data.

* * * * *

UNITED STATES PATENT AND TRADEMARK OFFICE
CERTIFICATE OF CORRECTION

PATENT NO. : 6,698,009 B1
DATED : February 24, 2004
INVENTOR(S) : Alexander J. Pasadyn and Christopher A. Bode It is certified that error appears in the above-identified patent and that said Letters Patent is hereby corrected as shown below:

Column 1,
Line 55, replace "Each," with -- Each --.
Line 56, replace "toot" with -- tool --.

Signed and Sealed this

Twenty-second Day of June, 2004

JON W. DUDAS
*Acting Director of the United States Patent and Trademark Office*